US011131360B2

(12) United States Patent
Shrinkle et al.

(10) Patent No.: US 11,131,360 B2
(45) Date of Patent: Sep. 28, 2021

(54) VIBRATION ISOLATION APPARATUSES FOR CRYSTAL OSCILLATORS

(71) Applicant: VIASAT, INC., Carlsbad, CA (US)

(72) Inventors: Steven Shrinkle, Vista, CA (US); Kenneth Larson, Escondido, CA (US); Christopher Haas, Carlsbad, CA (US)

(73) Assignee: Viasat, Inc., Carlsbad, CA (US)

( * ) Notice: Subject to any disclaimer, the term of this patent is extended or adjusted under 35 U.S.C. 154(b) by 673 days.

(21) Appl. No.: 15/780,357

(22) PCT Filed: Dec. 1, 2016

(86) PCT No.: PCT/US2016/064458
§ 371 (c)(1),
(2) Date: May 31, 2018

(87) PCT Pub. No.: WO2017/096064
PCT Pub. Date: Jun. 8, 2017

(65) Prior Publication Data
US 2018/0347658 A1    Dec. 6, 2018

Related U.S. Application Data

(60) Provisional application No. 62/262,808, filed on Dec. 3, 2015.

(51) Int. Cl.
*F16F 9/30* (2006.01)
*H03H 9/05* (2006.01)
(Continued)

(52) U.S. Cl.
CPC .............. *F16F 9/306* (2013.01); *F16F 15/04* (2013.01); *G10K 11/168* (2013.01); *H03H 9/0504* (2013.01); *B32B 2307/56* (2013.01)

(58) Field of Classification Search
CPC .............. H03H 9/0504; B32B 2307/56; G10K 11/168; F16F 9/306; F16F 15/04
(Continued)

(56) References Cited

U.S. PATENT DOCUMENTS 5,695,867 A    12/1997 Saitoh et al.
9,147,831 B2 *  9/2015 Kuroda ............... H03H 9/1014
(Continued)

FOREIGN PATENT DOCUMENTS

CN    201947227 U    8/2011
CN    103338020 A    10/2013
(Continued)

OTHER PUBLICATIONS

International Search Report and Written Opinion mailed in International (PCT) Application No. PCT/US2016/064458 dated Oct. 4, 2017, 13 pgs.
(Continued)

*Primary Examiner* — Forrest M Phillips
(74) *Attorney, Agent, or Firm* — Holland & Hart LLP

(57) ABSTRACT

Methods, systems, and devices are described for isolating a crystal oscillator assembly from shock and/or vibration inputs. A system may include one or more vibration isolators coupled between the crystal oscillator assembly and the base structure, and each of the vibration isolators may include a spring material layer and a damping material layer. The spring material layer may provide a spring force between the crystal oscillator assembly and the base structure. The damping material layer may be adhered to at least one side of the spring material layer, and may provide a damping force between the crystal oscillator assembly and the base structure. Some vibration isolators may further include a constraint layer adhered to the damping material layer, such
(Continued)

that the damping material layer is coupled between the constraint layer and the spring material layer.

20 Claims, 8 Drawing Sheets

(51) Int. Cl.
  *F16F 15/04* (2006.01)
  *G10K 11/168* (2006.01)
(58) Field of Classification Search
  USPC .......................................................... 181/208
  See application file for complete search history.

(56) References Cited

U.S. PATENT DOCUMENTS

| | | | |
|---|---|---|---|
| 9,161,450 B2* | 10/2015 | Kamakura | H05K 1/181 |
| 9,935,609 B2* | 4/2018 | Maibara | H03H 9/1014 |
| 2002/0096974 A1* | 7/2002 | Moon | H03H 9/215 |
| | | | 310/345 |
| 2004/0253453 A1 | 12/2004 | Myers et al. | |
| 2005/0019590 A1 | 1/2005 | Josefsson | |
| 2005/0127574 A1 | 6/2005 | Knowles et al. | |
| 2008/0196968 A1* | 8/2008 | Boock | G10K 11/16 |
| | | | 181/208 |
| 2009/0252989 A1 | 10/2009 | Swanson et al. | |
| 2012/0199433 A1 | 8/2012 | Kawaguchi | |
| 2013/0278112 A1 | 10/2013 | Yokoyama | |
| 2014/0339037 A1 | 11/2014 | Kawaguchi | |

FOREIGN PATENT DOCUMENTS

| | | |
|---|---|---|
| CN | 103944513 A | 7/2014 |
| DE | 4007631 A1 | 9/1990 |
| EP | 0663542 A1 | 7/1995 |
| EP | 1566565 A1 | 8/2005 |
| EP | 2944844 A2 | 11/2015 |
| WO | WO 1981/002718 A1 | 10/1981 |
| WO | WO 2000/002204 A1 | 1/2000 |
| WO | WO 2017/096064 A1 | 6/2017 |

OTHER PUBLICATIONS

International Preliminary Report on Patentability mailed in International (PCT) Application No. PCT/US2016/064458 dated Jun. 14, 2018, 11 pgs.
Renninger, "Understanding Damping Techniques for Noise and Vibration Control", EAR Division, Cabot Corporation, http://www.earsc.com/pdfs/engineering/understandingdamping.pdf, 2000, 8 pgs.
Verstappen et al., "Patterned fibre constrained layer damping for composite materials", http://www.acoustics.asn.au/conference_proceedings/INTERNOISE2014/papers/p905.pdf, 2014, 9 pgs.

* cited by examiner

VIBRATION ISOLATION APPARATUSES FOR CRYSTAL OSCILLATORS

CROSS REFERENCES

The present Application for Patent claims priority to U.S. Provisional Patent Application No. 62/262,808 by Shrinkle, et al., entitled "Vibration Isolation Structure for Crystal Oscillator," filed Dec. 3, 2015, and assigned to the assignee hereof, the entirety of which is expressly incorporated herein for any and all purposes.

BACKGROUND

Vibration isolation may be employed when mounting a crystal oscillator at a location that may experience vibration or shock loading. These locations may include various vehicles (land-based vehicles, water-borne vehicles, airborne vehicles, orbital vehicles, etc.), or ground-based locations that may experience seismic or other vibrational or shock loading. Vibration and shock loading may cause damage to a crystal oscillator, including unintentional component contact, mechanical damage (e.g. yielding, rupture, etc.), fatigue damage, loosening of components, separation of electrical connections, intermittent degradation of electrical connections, and others. Vibration and shock loading may also result in degraded system performance, including missed cycles, erroneous extra cycles, or a change in resonant frequency of the crystal oscillator. Quartz-based crystal oscillators are particularly sensitive to vibration and shock, and can be permanently damaged from even mild levels of vibration. Thus, vibration isolators may be designed to isolate a crystal oscillator assembly from vibrations or shock loading in order to improve performance of those crystal oscillators sensitive to such conditions.

To isolate a crystal oscillator from vibrations or shock loading, it may be desirable to implement a compliance between a crystal oscillator assembly and a base structure, where the compliance is associated with a relatively low natural frequency of dynamics between the crystal oscillator and the base structure. With a relatively low natural frequency, energy associated with relatively higher frequency vibrations or shock loading can be stored and/or dissipated by the compliance, rather than being transmitted from the base structure to the crystal oscillator assembly. However, achieving proper damping of motions between the crystal oscillator and the base structure can be challenging. Some isolation structures, such as wire rope dampers, rely on friction to dissipate kinetic energy, which can result in unfavorable dynamic behavior due to static friction being relatively greater than dynamic friction. In such systems, stiffness or damping characteristics for certain inputs (e.g., inputs that are not strong enough to exceed static friction in a friction element, or inputs that intermittently exceed static friction in a friction element) may be disproportionately high, such that the isolator may, in fact, be relatively rigid to those inputs. Furthermore, the transition between static friction and dynamic friction may cause a discontinuity in forces and accelerations between a crystal oscillator assembly and a base structure, which may cause dynamic amplification or other dynamic instability. Thus, vibration isolators that rely on friction for energy absorption may fail to isolate a crystal oscillator from certain vibration and shock inputs, which may be detrimental to the performance of a system relying on the performance of the crystal oscillator assembly.

SUMMARY

Methods, systems, and devices are described for providing isolation of shock and/or vibration inputs between a base structure and a crystal oscillator assembly. For example, a system may include one or more vibration isolators coupled between a crystal oscillator assembly and a base structure, where the vibration isolators support a sprung mass of the crystal oscillator assembly with respect to the base structure. Each of the vibration isolators may include a spring material layer and a damping material layer. The spring material layer may provide a spring force between the crystal oscillator assembly and the base structure in response to relative movement between the crystal oscillator assembly and the base structure. The damping material layer may be adhered to at least one side of the spring material layer, and may provide a damping force between the crystal oscillator assembly and the base structure in response to the relative movement between the crystal oscillator assembly and the base structure. Some vibration isolators may further include a constraint layer adhered to the damping material layer opposite from the spring material layer, such that the damping material layer is coupled between the constraint layer and the spring material layer. The constraint layer may increase the degree of strain in the damping layer, which may increase the damping force of the constraint layer relative to designs without a constraint layer. Vibration isolators may be formed in various configurations, including circumferential rings or arcuate bands of various shapes. Vibration isolators may also be formed of various materials, which may be selected based on the desired properties of each of the layers. A crystal oscillator system may include various numbers of vibration isolators coupled in various orientations and in various locations between a crystal oscillator assembly and a base structure in order to meet various design criteria, including stiffness, damping, natural frequency, and shock energy absorption characteristics in various directions.

Further scope of the applicability of the described methods and apparatuses will become apparent from the following detailed description, claims, and drawings. The detailed description and specific examples are given by way of illustration only, since various changes and modifications within the scope of the description will become apparent to those skilled in the art in view of the present disclosure.

BRIEF DESCRIPTION OF THE DRAWINGS

A further understanding of the nature and advantages of various aspects of the present disclosure may be realized by reference to the following drawings. In the appended figures, similar components or features may have the same primary reference label. Further, various components of the same type may be distinguished by following the primary reference label by a dash and one or more subsequent reference labels that distinguish among the similar components. The description referring to only the primary reference label may apply to any of the similar components unless otherwise indicated, while descriptions of examples having one or more subsequent reference labels may be generally applicable to other examples of the similar components having the same primary reference label.

DETAILED DESCRIPTION

The described features generally relate to vibration isolators, and in particular to vibration isolators that implement a damping material layer adhered to a spring material layer to provide isolation between a crystal oscillator and a base assembly. By providing vibration isolators in such configurations, a crystal oscillator may have favorable performance characteristics as compared with other vibration isolation systems, such as those vibration isolation systems that implement friction elements for energy dissipation. In some examples vibration isolation according to the present disclosure may also permit the use of a non-ruggedized crystal oscillator, which may reduce system cost or complexity, and/or improve packaging of a crystal oscillator.

This description provides examples, and is not intended to limit the scope, applicability or configuration of embodiments of the principles described herein. Rather, the ensuing description will provide those skilled in the art with an enabling description for implementing embodiments of the principles described herein. Various changes may be made in the function and arrangement of elements, as will be apparent to one of ordinary skill in the art in view of the present disclosure. For example, although described primarily with regard to the isolation of crystal oscillators, it will be apparent that the methods and apparatuses of the present disclosure are more broadly applicable to vibration isolation in other applications, including any other type of equipment that is sensitive to vibration or shock loading, electronic or otherwise. Various embodiments may omit, substitute, or add various components as appropriate. For instance, it should be appreciated that the apparatuses may be arranged in an order different than arrangements described, and that various components may be added, omitted or combined. Also, aspects and elements described with respect to certain embodiments may be combined in various other embodiments. It should also be appreciated that the following systems and devices may individually or collectively be components of a larger system.

Figure 1:
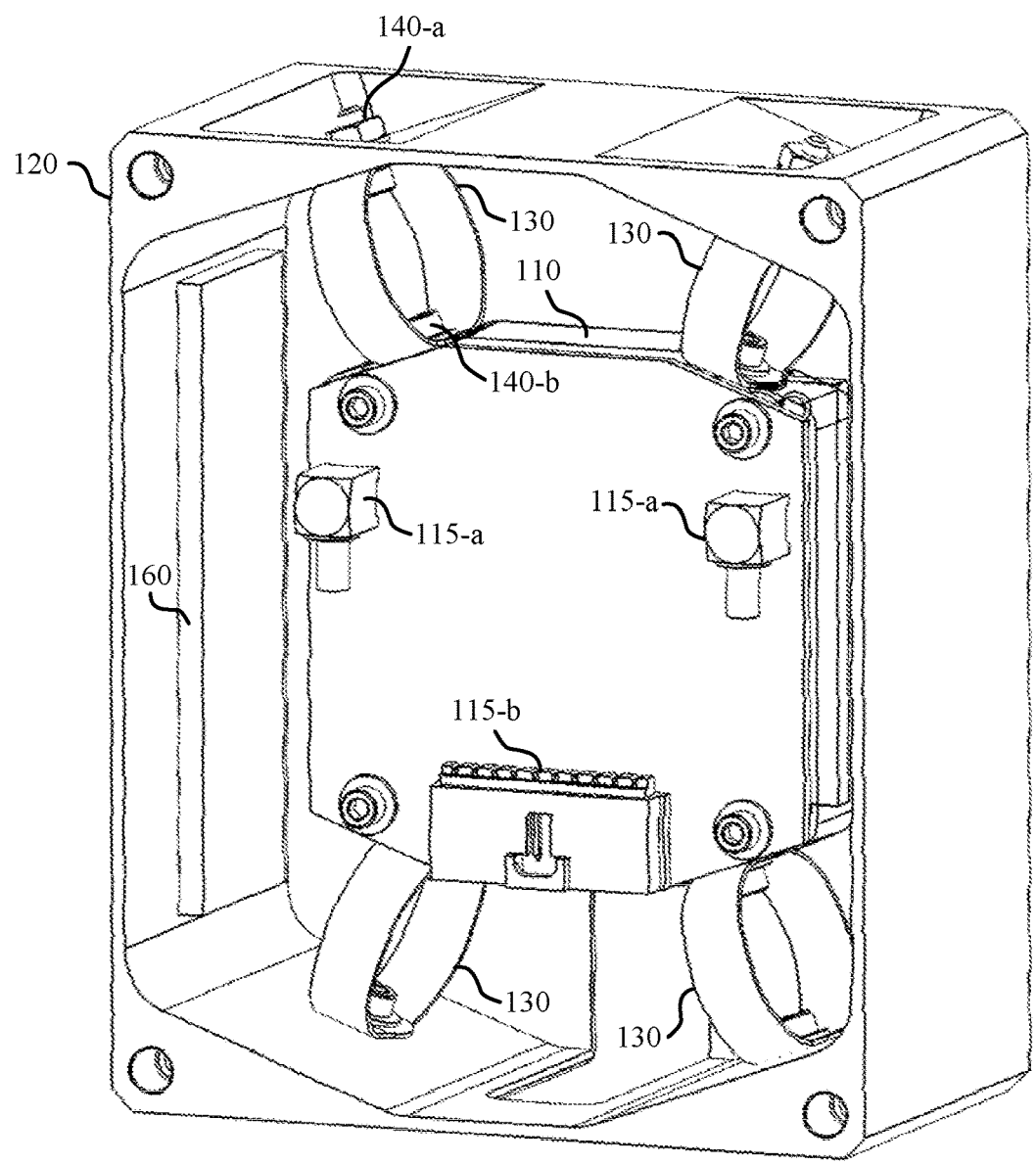
FIG. 1 shows an example of a crystal oscillator system in accordance with aspects of the present disclosure.

FIG. 1 shows an example of a crystal oscillator system 100 in accordance with aspects of the present disclosure. The crystal oscillator system 100 may include a crystal oscillator assembly 110 (e.g., a first device) and a base structure 120 (e.g., a second device). In the example of crystal oscillator system 100, four vibration isolators 130 may be coupled between the crystal oscillator assembly 110 and the base structure 120, and the vibration isolators 130 may support the sprung mass of the crystal oscillator assembly 110 with respect to the base structure 120.

The crystal oscillator assembly 110 may include a crystal oscillator, such as a quartz-based crystal oscillator. The crystal oscillator may be mounted to a circuit assembly, which may be an example of a printed wiring assembly (PWA) or a printed circuit board (PCB). As shown by the crystal oscillator assembly 110, the circuit assembly including the crystal oscillator may be contained in an enclosure, which may include connectors 115 for providing electrical connections via wires or cables (not shown) to other portions of a device that includes the crystal oscillator system 100. For example, the crystal oscillator assembly 110 includes coaxial connectors 115-a suitable for transmitting relatively high frequency signals (e.g., signals associated with the crystal oscillator), and a cable harness connector 115-b suitable for providing power to the crystal oscillator assembly 110, and/or relatively low-frequency signals to/from the crystal oscillator assembly 110 such as diagnostic signals, control signals, and the like.

In the example of crystal oscillator system 100, the base structure 120 may be an enclosure dedicated to housing the crystal oscillator assembly 110. In other examples the base structure 120 may not be an enclosure, but may be a part of a larger assembly that includes the crystal oscillator system 100. In operation, the base structure 120 may be subject to various vibrations and/or shock loading. For example, when the base structure 120 is coupled to a vehicle (e.g., a land-based vehicle, a water-borne vehicle, an airborne vehicle, an orbital vehicle, etc.), the base structure may be subject to vibrations from a propulsion system, accelerations due to vehicle movements, and/or impacts of the vehicle with other objects. In other examples the base structure 120 may be part of a stationary installation that may be subject to vibrations from adjacent machinery, seismic loading, environmental loading such as wind or precipitation, or any other imposed loading. Because crystal oscillators are sensitive to such vibration and/or shock loading, it is desirable to isolate the crystal oscillator assembly 110 from such loading borne by the base structure 120. Accordingly, a crystal oscillator system 100 may include one or more vibration isolators 130 coupled between the crystal oscillator assembly 110 and the base structure 120.

As shown in the example of crystal oscillator system 100, four vibration isolators 130 may be coupled between the crystal oscillator assembly 110 and the base structure 120, thereby supporting the sprung mass of the crystal oscillator assembly 110 with respect to the base structure 120 (e.g., supporting the sprung mass in all degrees of freedom). As used herein, "sprung mass" of a crystal oscillator assembly 110 refers to the mass supported by the vibration isolators 130 of a crystal oscillator system 100 with respect to a base structure 120, which includes the mass of the crystal oscillator assembly 110. The sprung mass of the crystal oscillator assembly 110 may also include the mass of connectors connected to the crystal oscillator assembly 110 and at least a portion of the mass of associated cables or wiring coupled to the connectors. The sprung mass of the crystal oscillator assembly 110 may also include at least a portion of the mass of coupled vibration isolators 130, and any fasteners associated with such coupling. Accordingly, the natural frequency of dynamics between a crystal oscillator assembly 110 and the base structure 120 may be based at least in part on the sprung mass of the crystal oscillator assembly 110, as well as intervening stiffness and damping provided by the vibration isolators 130.

In various examples, a crystal oscillator system may include two or more vibration isolators 130 distributed about an axis of symmetry. For example, the vibration isolators 130 may be distributed in a circular pattern, a square pattern, or a polygonal pattern about the axis of symmetry. The distance of the vibration isolators 130 from the axis of symmetry may be chosen to provide a desired rotational stiffness about the axis of symmetry, or about other axes. For example, for a given translational stiffness in the X direction, vibration isolators 130 may be moved farther from each other in the Y direction and/or the Z direction to provide a higher rotational stiffness about the X direction, Y direction, or Z direction. In some examples, a sprung mass associated with a crystal oscillator assembly 110 may be located at a position coincident with the described axis of symmetry of vibration isolators 130. For example, it may be desirable to prevent, or otherwise minimize translational accelerations of the base structure 120 from being converted into rotations of the crystal oscillator assembly 110. These and other design freedoms may be used to balance natural frequency and isolation characteristics between translational effects and rotational effects.

Each of the vibration isolators 130 may include a spring material layer for providing a spring force between the crystal oscillator assembly 110 and the base structure 120 in response to relative movement between the crystal oscillator assembly 110 and the base structure 120. Each of the vibration isolators 130 may also include a damping material layer adhered to at least one side of the spring material layer, where the damping material layer provides a damping force between the crystal oscillator assembly 110 and the base structure 120 in response to the relative movement between the crystal oscillator assembly 110 and the base structure 120. Some vibration isolators may further include a constraint layer adhered to the damping material layer opposite from the spring material layer, such that the damping material layer is coupled between the constraint layer and the spring material layer. The constraint layer may increase the degree of strain in the damping layer, which may increase the damping force of the constraint layer relative to designs without a constraint layer. In such examples, the damping force provided between the crystal oscillator assembly 110 and the base structure 120 may be referred to as constrained layer damping. Although four vibration isolators 130 are shown as generally located at corners of the crystal oscillator assembly 110, more or fewer vibration isolators 130 may be coupled between a crystal oscillator assembly 110 and a base structure 120 in various configurations to provide suitable stiffness and damping characteristics according to other examples of crystal oscillator systems.

In the example of crystal oscillator system 100, the vibration isolators 130 may be coupled to the base structure 120 by fasteners 140-a (of which only one is labeled for clarity), and coupled to the crystal oscillator assembly 110 by fasteners 140-b (of which only one is labeled for clarity). Fasteners 140-a may include a bolt that passes through corresponding holes in each of a vibration isolator 130 and the base structure 120, and secured with a nut. Fasteners 140-b may include a screw that passes through a hole in a vibration isolator 130 and secured in a threaded hole in the enclosure of the crystal oscillator assembly 110. In other examples, fasteners 140 may include rivets, or may include threaded holes, threaded inserts, threaded studs, or other fastener portions integrated into one or more of a crystal oscillator assembly 110, a base structure 120, and/or a vibration isolator 130. In other examples, vibration isolators 130 may be coupled to a crystal oscillator assembly 110 or a base structure 120 without mechanical fasteners 140 by way of welding, brazing, soldering, adhesive bonding, or any other suitable means.

The components of the crystal oscillator system 100 may be arranged to provide suitable stiffness and damping performance when exposed to vibration and shock inputs in various directions. For example, the crystal oscillator system 100 may be designed according to a coordinate system 150, which may be related to the installed orientation of the crystal oscillator system 100. In some examples, the X direction may correspond to a fore-aft direction of a vehicle, the Y direction may correspond to a lateral direction of the vehicle, and the Z direction may be a vertical direction of the vehicle, which may be generally aligned in the direction of gravity. In such examples, the crystal oscillator system 100 may be designed according to anticipated vibration and/or shock loading borne by the base structure 120 in each of the X direction, the Y direction, and the Z direction. For example, it may be particularly important to have a relatively low natural frequency in the X direction to provide relatively lower frequency isolation of vibrations in the X direction. It may also be important to absorb relatively large shock energy in the Z direction due to vertical inputs through the vehicle, in which case it may be preferable to be moderately stiff in the Z direction, and/or to permit relatively large excursions between the crystal oscillator assembly 110 and the base structure 120 in the Z direction 9 (e.g., by having vibration isolators be relatively long in the Z direction). In some examples, it may be desirable to have relatively high stiffness in the Z direction in order to support the sprung mass of the crystal oscillator assembly against gravity with relatively small displacement of the crystal oscillator assembly 110 relative to the base structure 120.

In other examples the crystal oscillator system 100 may be part of a stationary installation, in which case the Z direction may also be generally aligned in the direction of gravity, and the X direction and Y direction may be of relatively minimal importance with reference to the installation location. Instead, the crystal oscillator assembly 110, or more particularly the crystal oscillator included in the crystal oscillator assembly 110, may be particularly sensitive to vibrations in the X direction. Thus, the crystal oscillator system 100 may be designed with relatively low stiffness in the X direction to provide lower-frequency isolation of shock and/or vibration loading between the crystal oscillator assembly 110 and the base structure 120 in the X direction.

Although described separately with reference to orientations of vibration and shock inputs of a particular installation, and orientations of vibration sensitivity of a crystal oscillator assembly 110, a crystal oscillator system 100 may be designed according to various combinations of design criteria. More generally, in view of the descriptions of the present disclosure, it will be apparent that vibration isolators 130 may be designed and configured with various characteristics to achieve desired performance (e.g., stiffness, damping, natural frequency, energy absorption, etc.) along different orientations of a crystal oscillator system 100. Further, to accommodate extreme excursions between a crystal oscillator assembly 110 and a base structure 120, it may be further desirable to include bumpers for softening physical contact between the crystal oscillator assembly 110 and the base structure 120. For example, as shown in crystal oscillator system 100, bumpers 160 may be attached to the base structure 120. Additionally or alternatively, bumpers 160 may be installed on the crystal oscillator assembly 110.

Thus, according to various aspects of the present disclosure, vibration isolators 130 having a spring material layer and a damping material layer may be provided between a crystal oscillator assembly 110 and a base structure 120 to support a sprung mass of the crystal oscillator assembly 110 with respect to the base structure 120, while also attenuating vibration and shock loading borne by the base structure 120 from being transmitted to the crystal oscillator assembly 110.

Figure 2:
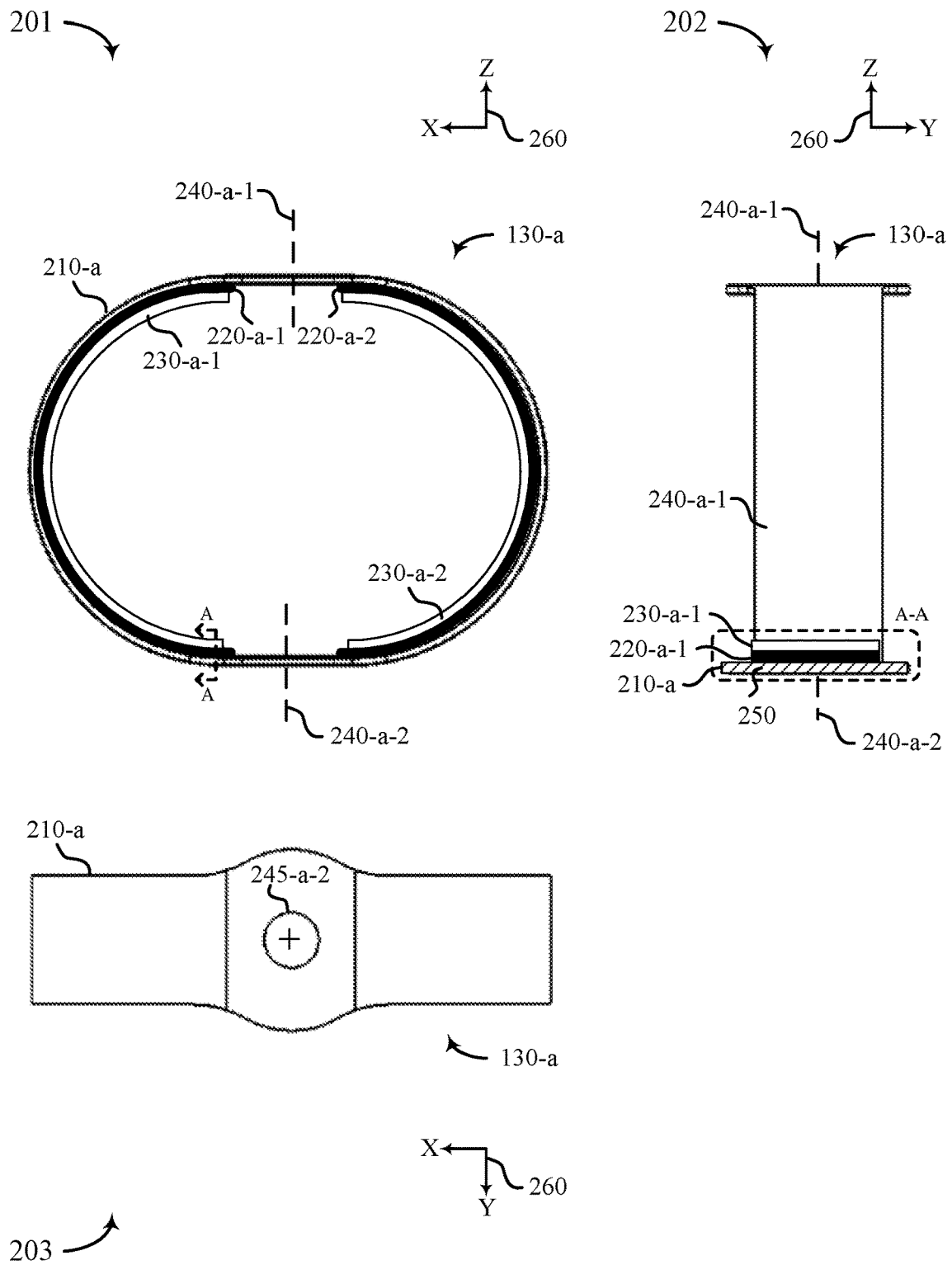
FIG. 2 shows a front view, a side view, and a top view of an example of a vibration isolator in accordance with aspects of the present disclosure.

FIG. 2 shows a front view 201, a side view 202 (including partial section view A-A), and a top view 203 of an example of a vibration isolator 130-a in accordance with aspects of the present disclosure. As shown, the vibration isolator 130-a includes a spring material layer 210-a, a first damping material layer 220-a-1, a second damping material layer 220-a-2, a first constraint layer 230-a-1, and a second constraint layer 230-a-2. The vibration isolator is described according to a coordinate system 260 as shown in each of the front view 201, the side view 202, and the top view 203. Because the shape of the spring material layer 210-a encloses an area (e.g., in the direction shown by front view 201), the vibration isolator 130-a may be an example of a circumferential vibration isolator, which has a circumferential length around the area enclosed by the spring material layer 210-a in the X-Z plane of front view 201.

The spring material layer 210-a may enclose a shape (e.g., as shown in front view 201) chosen for providing a desired spring force between a crystal oscillator assembly 110 and a base structure 120 in response to relative movement between the crystal oscillator assembly 110 and the base structure 120. The stiffness associated with the spring force may be configured with different characteristics in different directions (e.g., for relative movements between the crystal oscillator assembly 110 and the base structure 120 in the X direction, Y direction, or Z direction of coordinate system 260). Furthermore, the shape of the cross sectional area enclosed by the spring material layer 210-a may be selected to provide a variable stiffness (e.g., a progressive stiffness), such that a stiffness in a given direction of the spring material layer 210-a changes based on a relative deformation in the given direction.

As shown, the spring material layer 210-a of the vibration isolator 130-a may be described as enclosing a cross sectional area, as shown by front view 201, having two flat portions that are connected by semi-circular arcs. The flat portions may correspond to coupling locations 240-a-1 and 240-a-2, where one of the coupling locations 240-a-1 or 240-a-2 may be coupled with a crystal oscillator assembly 110, and the other may be coupled to a base structure 120. In some examples the coupling locations may be associated with a mounting hole, such as the mounting hole 245-a-2 associated with the coupling location 240-a-2. Coupling locations 240 may also be associated with integrated coupling features such as a threaded stud, a threaded hole, a threaded insert, or a surface suitable for welding, brazing, soldering, or adhesive bonding.

In some examples of the vibration isolator 130-a, the enclosed cross sectional area of the spring material layer 210-a may be selected for applications where it is desirable to support the sprung mass of a crystal oscillator assembly 110 with a relatively low natural frequency in the X direction, which may generally be the most compliant direction for the cross sectional shape of the vibration isolator 130-a. Accordingly, it may be preferable in some installations to orient the X direction of the vibration isolator 130-a in a direction of vibration and/or shock inputs from a base structure 120 that are to be isolated at the lowest frequency. Additionally or alternatively, it may be preferable to orient the X direction of the vibration isolator in a direction of a crystal oscillator assembly 110 that has the highest sensitivity to low-frequency inputs, thereby requiring the greatest low frequency isolation. In the example of vibration isolator 130-a, the enclosed cross sectional shape may also be configured such that the damping material layers 220-a-1 and 220-a-2 are most effective at dissipating vibration and/or shock energy in the X direction (e.g., due to a relatively high conversion of relative motion between a crystal oscillator assembly 110 and a base structure 120 in the X direction into transverse shear in the damping material layers 220-a-1 and 220-a-2). Accordingly, it may also be preferable to orient the X direction of the vibration isolator 130-a in a direction where high energy dissipation is desirable.

In some examples of the vibration isolator 130-a, the stiffness of the vibration isolator in the Z direction may be somewhat higher than the stiffness in the X direction (e.g., a moderate stiffness), but may still provide a suitable isolation, stiffness, and/or natural frequency for a crystal oscillator system in the corresponding direction (e.g., as it relates to the as-installed orientation of the vibration isolator 130-a). For example, the Z direction of the vibration isolator 130-a may be oriented in a direction of a crystal oscillator system 100 that experiences relatively high shock loading energy, such that the stiffness in the Z direction that is relatively higher than the stiffness in the X direction may effectively absorb and/or dissipate such shock loading energy.

In some examples of the vibration isolator 130-a, the stiffness of the vibration isolator 130-a may be relatively highest in the Y direction. Accordingly, the Y direction of the vibration isolator 130-a may be aligned in a direction for which relative displacements between a crystal oscillator assembly 110 and a base structure 120 are to be limited (e.g., for packaging reasons), and/or in a direction for which a crystal oscillator assembly 110 is relatively insensitive to transmitted shock and/or vibration loading.

The spring material layer 210-a may be formed from a band of material having a rectangular cross section as viewed perpendicular to the circumferential length of the circumferential ring of the vibration isolator 130-a (e.g., rectangular cross section 250 shown in partial section view A-A). In some examples it may be preferable to configure the rectangular cross-section with a width measured in a direction perpendicular to a plane of an area enclosed by the circumferential ring (e.g., in the Y direction of the coordinate system 260) that is greater than a thickness measured in a direction from the area enclosed by the circumferential ring in the plane of the area enclosed by the circumferential ring (e.g., in the Z direction of coordinate system 260). This configuration may provide relatively low bending stiffness of the spring material layer 210-a about the Y direction, facilitating relatively low stiffness and associated natural frequency in the X direction and Z direction, while also providing a relatively large surface area for adhering the damping material layers 220-a-1 and 220-a-2.

The spring material layer 210-a may be formed from a material that has favorable properties for providing a spring force between a crystal oscillator assembly 110 and a base structure 120. For example, the chosen spring material may have a favorable modulus of elasticity for providing a particular stiffness and/or natural frequency between the crystal oscillator assembly 110 and the base structure 120. The spring material may also be chosen for favorable fatigue properties, such as a well-defined endurance limit and a stable modulus of elasticity over time and/or over a number of loading cycles. The spring material may also be chosen for stable elastic properties with respect to temperature changes or other environmental factors. Spring steel or similar alloys may be preferred for the spring material layer 210-a in some applications, but other suitable materials may include other metals, metal alloys, polymers, or composites.

The first damping material layer 220-a-1 and the second damping material layer 220-a-2 may each be adhered to the spring material layer 210-a. In some examples the damping material layers 220-a-1 and 220-a-2 may be adhered by a separate adhesive layer (e.g., as integrated with the spring material layer 210-a and/or the damping material layers 220-a-1 or 220-a-2). In other examples the chosen damping material itself may have adhesive properties that do not require the use of a separate adhesive layer. For example, the damping material layers 220-a-1 and 220-a-2 may be co-molded or extruded on the spring material layer 210-a, or the spring material layer 210-a may be dipped in a fluid form of the damping material, which may then be cured.

The first damping material layer 220-a-1 and the second damping material layer 220-a-2 may provide a damping force between a crystal oscillator assembly 110 and a base structure 120 in response to relative movement between the crystal oscillator assembly 110 and the base structure 120. The damping force may generally dissipate energy transferred through the vibration isolator 130-a due to vibration and/or shock loading, and may also reduce oscillation that would otherwise be experienced through the vibration isolator 130-a due to the natural frequency of a crystal oscillator assembly 110 being supported by one or more vibration isolator(s) 130-a.

The damping force may include a hysteretic damping force, a viscous damping force, or a combination thereof. A hysteretic damping force may refer to a force associated with a dissipation of kinetic energy that is based on a relative displacement (e.g., normal strain, shear strain, or a combination thereof), but not dependent on the rate of relative displacement (e.g., strain rate). A viscous damping force may refer to a force associated with a dissipation of kinetic energy that is based on the rate of relative displacement, but not the relative displacement itself. Some materials may be characterized as providing a combination of both a hysteretic damping force and a viscous damping force, which may alternatively be referred to as a rate-dependent hysteretic force.

Generally, materials suitable for providing a hysteretic and/or viscous damping force in the damping material layers 220-a-1 and 220-a-2 may also exert an elastic force, which may refer to force based on a relative displacement that is not associated with a dissipation of energy. Examples of such materials that combine elastic and damping properties may be referred to as viscoelastic materials, which may include formulations of natural or synthetic rubbers or other polymers, and may be applied in substantially solid form, or open-cell or closed-cell foam form. In order to increase the damping force provided by the damping material layers 220-a-1 and 220-a-2, the volume of the damping material may be increased for greater energy dissipation, which may be accomplished by depositing a wider layer of damping material (e.g., in the Y direction), a thicker layer of damping material (e.g., in the Z direction of partial cross sectional view A-A), or by depositing a longer layer of damping material (e.g., along the circumferential length of the spring material layer 210-a. In some examples, although a viscoelastic material may impose an elastic force in a vibration isolator 130, the elastic force of the damping material layer 220 may be insignificant when compared to the elastic force provided by a spring material layer 210.

As shown by the vibration isolator 130-a, some vibration isolators may also include a constraint layer (e.g., first constraint layer 230-a-1 and second constraint layer 230-a-2) adhered to the damping material layers 220-a-1 and 220-a-2 opposite from the spring material layer 210-a, such that the damping material layers are coupled between the constraint layers and the spring material layer 210-a. In general, the constraint layers 230-a-1 and 230-a-2 may limit strain at the surface of the damping material layers 220-a-1 and 220-a-2 opposite from the spring material layer. By limiting strain at the surface of the damping material layers 220-a-1 and 220-a-2 opposite from the spring material layer 210-a, the constraint layers 230-a-1 and 230-a-2 may increase transverse shear through the volume of the damping material layers 220-a-1 and 220-a-2 as compared to vibration isolators 130 without a constraint layer. Increasing transverse shear in a damping material may, in some applications, improve the dissipation of energy associated with relative displacements of the vibration isolator 130. In such examples, the damping force provided by a vibration isolator 130 may be referred to as constrained layer damping.

The constraint layers 230-a-1 and 230-a-2 may be formed from any suitable material that provides in-plane stiffness that limits shear at the surface of the damping material layers 220-a-1 and 220-a-2, and need not provide any particular stiffness in other directions. For example, the constraint layers 230-a-1 and 230-a-2 may be formed from a thin composite sheet adhered to the damping material layers 220-a-1 and 220-a-2, and the composite sheet may have negligible out-of-plane stiffness, which may be particularly suitable for applications where the overall stiffness of the vibration isolator 130-a is to be minimized. In other examples, however, it may be preferred that the constraint layers 230-a-1 and 230-a-2 provide some out-of-plane stiffness, thereby acting together with the spring material layer 210-a to provide at least a portion of the stiffness associated with the vibration isolator 130-a (e.g., providing a second spring force, adding to the spring force of the spring material layer 210-a, in response to relative movement between a crystal oscillator assembly 110 and a base structure 120). For example, in some applications the constraint layers 230-a-1 and 230-a-2 may be made from any of the materials described with reference to the spring material layer 210-a, and may in some examples be formed from the same material as the spring material layer 210-a (e.g., two layers of spring steel).

Although particular characteristics are described for particular directions of the vibration isolator 130-a, these characteristics are provided as illustrative examples only. In view of the present disclosure, it will be apparent to one of ordinary skill in the art that modifications to the described features can be made to achieve stiffness, damping, natural frequency, and/or energy absorption characteristics in various directions as desired for a particular application of vibration isolators that employ a spring material layer and a damping material layer.

Figure 3:
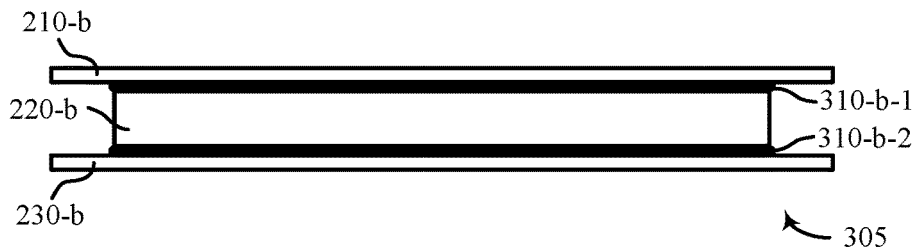
FIG. 3 illustrates examples of loading scenarios that may impose strain loading in a damping layer in accordance with aspects of the present disclosure.
Figure 3:
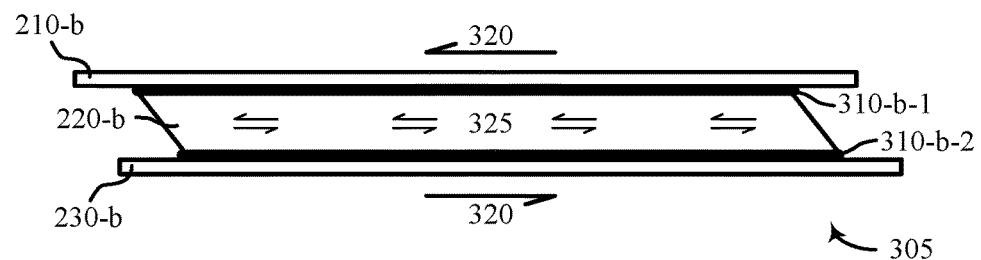
Figure 3:
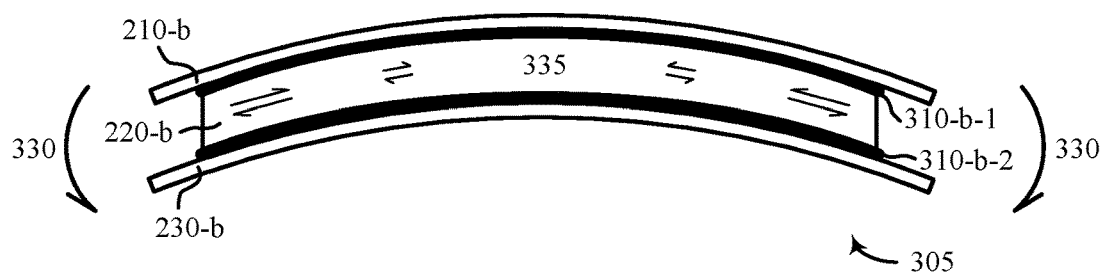

FIG. 3 illustrates examples of loading scenarios 301, 302, and 303 that may impose strain loading in a damping material layer 220 in accordance with aspects of the present disclosure. Loading scenarios 301, 302, and 303 are described with reference to a layer stack 305, which includes a spring material layer 210-b, a damping material layer 220-b, and a constraint layer 230-b. The damping material layer 220-b may include, for example, a viscoelastic material having elastic properties along with hysteretic and/or viscous damping properties. In the example of layer stack 305, the damping material layer 220-b is adhered to the spring material layer 210-b by a first adhesive layer 310-b-1, and adhered to the constraint layer 230-b by a second adhesive layer 310-b-1. The layer stack 305 may represent a stack of corresponding layers of a vibration isolator 130 as described herein.

Scenario 301 may represent a neutral condition of the layer stack 305. Although scenario 301 is shown without a distribution of strain in the damping material layer 220-b, the damping material may have some amount of strain in various locations due to, for example, residual strain of a manufacturing process. Thus, the strain described in scenarios 302 and 303 may represent a differential distribution of strain as compared to the neutral condition of scenario 301.

Scenario 302 represents a condition where a shear displacement 320 is imposed between the spring material layer 210-b and the constraint layer 230-b. The shear displacement 320 may impose a relatively uniform transverse shear distribution 325 throughout the volume of the damping material layer 220-b. The generation of transverse shear distribution 325 of the damping material layer 220-b may result in a dissipation of energy by way of hysteretic damping, viscous damping, or combinations thereof, which may impose a damping force upon the spring material layer 210-b. The shear displacement 320 may also be resisted by an elastic force of the damping material layer 220-b that is not associated with a dissipation of energy. The elastic force may be removed by returning the layer stack 305 to the neutral condition of scenario 301, but additional damping force may be imposed on the spring material layer 210-b due to further dissipation of energy by the damping material layer 220-b as the transverse shear distribution 325 is released.

Scenario 303 represents a condition where a bending moment 330 is imposed on the layer stack 305. The bending moment 330 may impose a non-uniform transverse shear distribution 335 throughout the volume of the damping material layer 220-b, where transverse shear is relatively high near the ends of the layer stack 305 and relatively low near the center of the layer stack 305. Like the transverse shear distribution 325, the generation of transverse shear distribution 335 of the damping material layer 220-b may also result in a dissipation of energy by way of hysteretic damping, viscous damping, or combinations thereof, which may impose a damping force upon the spring material layer 210-b. The bending moment 330 may also be resisted by a spring force associated with a bending stiffness of the spring material layer 210-b and/or the constraint layer 230-b, and/or an elastic force of the damping material layer 220-b that is not associated with a dissipation of energy. The spring force and elastic force may be removed by returning the layer stack 305 to the neutral condition of scenario 301, but additional damping force may be imposed on the spring material layer 210-b due to further dissipation of energy by the damping material layer 220-b as the shear distribution 335 is released.

Although the effects of shear loading 320 and bending moment 330 are shown in isolation, various loadings and shear distributions of a layer stack 305 (e.g., or a vibration isolator 130) may combine aspects of these, or other loadings. Furthermore, although scenarios 302 and 302 are illustrated with reference to transverse shear distributions 325 and 335, loading of a damping material layer 220 may also include aspects of normal (e.g., compressive and/or tensile) stress and strain, which may further contribute to stiffness and damping characteristics of a layer stack 305 as applied to various configurations of a vibration isolator 130.

Figure 4:
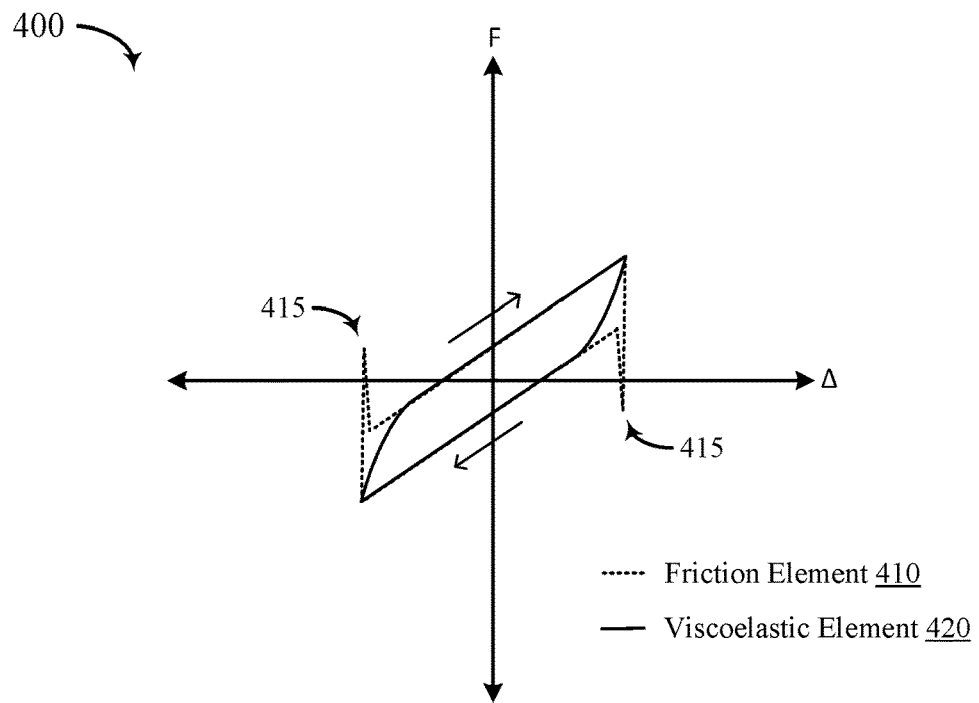
FIG. 4 shows a diagram plotting a generalized force versus a generalized displacement, illustrating example hysteresis curves for vibration isolators with a friction element or a viscoelastic element in accordance with aspects of the present disclosure.

FIG. 4 shows a diagram 400 plotting a generalized force F versus a generalized displacement $\Delta$, illustrating example hysteresis loops for vibration isolators with a friction element or a viscoelastic element in accordance with aspects of the present disclosure. As used herein, the generalized force F may represent aspects of a shear load, a normal (e.g., compressive/tensile) load, a bending load, or combinations thereof, as applied to a vibration isolator. Also, as used herein, $\Delta$ may represent aspects of a relative displacement, including a shear displacement, a linear displacement, a rotational displacement, or combinations thereof, as applied to the vibration isolator.

Hysteresis loop 410 may illustrate a characteristic behavior of a friction element vibration isolator having a friction element for dissipating vibrational and/or shock energy, such as a wire rope damper. Under vibration, the friction element vibration isolator may undergo positive and negative relative movement along the $\Delta$ axis, experiencing corresponding forces as shown along the F axis while generally following a clockwise path around the hysteresis loop. The area of the hysteresis loop 410 may be illustrative of an amount of energy dissipated by the friction element vibration isolator under the described vibration.

As shown by diagram 400, hysteresis loop 410 may be characterized by discontinuities 415, which may be associated with transitions from static friction to dynamic friction. Generally, static friction is higher than dynamic friction in a given application, and thus when a direction of relative movement is reversed (e.g., at the extremes in relative movement of the hysteresis loop 410 along the $\Delta$ axis, for which the friction element vibration isolator experiences static friction), friction force may be intermittently higher than when relative displacement is changing (e.g., when there is a rate of relative displacement for which the friction element vibration isolator experiences dynamic friction). In some examples, such as shown by hysteresis loop 410, the discontinuity associated with the relatively higher static friction may, in fact, reverse the direction of force. In other words, the force associated with static friction of the friction element vibration isolator may be greater than the elastic force of the friction element vibration isolator for a given displacement. In some examples the externally-imposed vibration and/or shock load may not be high enough to overcome this condition, in which case the friction element vibration isolator may be substantially rigid (e.g., transmitting a vibration and/or shock input directly from a base structure 120 to a crystal oscillator assembly 110), rendering the isolation inoperable at that condition.

When static friction of a friction element vibration isolator is overcome (e.g., overcoming a discontinuity 415 while traveling around the hysteresis loop 410), the imposed force may have a discontinuous step, which in some examples may reverse the net force of the friction element vibration isolator. In some examples this condition may amplify shock and/or vibration loading due to the sudden release of energy stored in elastic elements of the friction element vibration isolator, resulting in dynamic instabilities. Furthermore, the relatively low dynamic friction force may provide insufficient damping, such that the friction element vibration isolator operates in an underdamped condition as it relates to the support of a crystal oscillator assembly 110, which may result in oscillation amplification near the natural frequency of the crystal oscillator assembly with respect to a base structure. Thus, friction element vibration isolators have inherent characteristics that may impair their performance in isolating shock and/or vibration loading between a base structure 120 and a crystal oscillator assembly 110.

By way of contrast, hysteresis loop 420 may illustrate a characteristic behavior of a vibration isolator (e.g., a vibration isolator 130 as described herein) having a damping material layer 220 for dissipating vibrational and/or shock energy, such as a layer of viscoelastic material. Like the hysteresis loop 410 for a friction element vibration isolator, the area of the hysteresis loop 420 may be illustrative of an amount of energy dissipated by a vibration isolator 130 having a viscoelastic element. However, in contrast to the hysteresis loop 410, the hysteresis loop 420 does not include the discontinuities associated with the transition between static and dynamic friction. Rather, by having a relatively smooth transition in force when reversing direction, a vibration isolator 130 implementing a viscoelastic element may facilitate smooth isolation performance that lacks the relatively rigid characteristics, the sudden release of elastic energy, and the rapid drop in damping force described with reference to the hysteresis loop 410. Accordingly, a crystal oscillator system employing vibration isolators 130 formed with a spring material layer and a damping material layer as described herein may have improved shock and/or vibration isolation when compared to friction element vibration isolators that rely on friction elements for dissipating energy.

Figure 5:
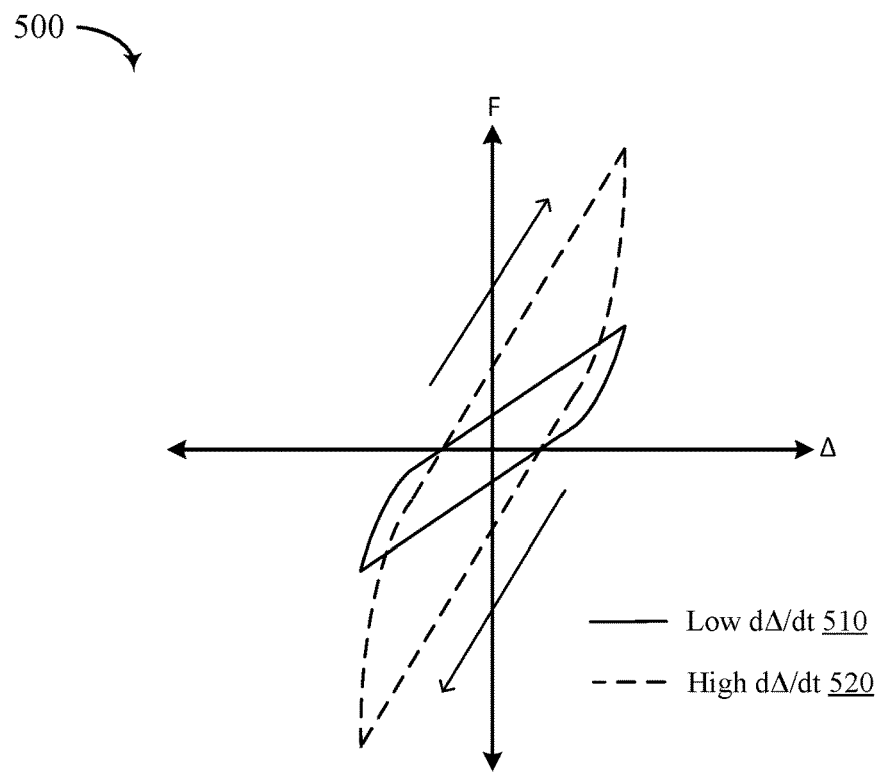
FIG. 5 shows a diagram plotting a generalized force versus a generalized displacement, illustrating example hysteresis curves for a vibration isolator having a damping layer that exhibits viscous damping properties in accordance with aspects of the present disclosure.

FIG. 5 shows a diagram 500 plotting a generalized force F versus a generalized displacement $\Delta$, illustrating example hysteresis curves for a vibration isolator 130 having a damping material layer that exhibits viscous damping properties in accordance with aspects of the present disclosure. As used herein, the generalized force F may represent aspects of a shear load, a normal (e.g., compressive/tensile) load, a bending load, or combinations thereof, as applied to a vibration isolator. Also, as used herein, $\Delta$ may represent aspects of a relative displacement, including a shear displacement, a linear displacement, a rotational displacement, or combinations thereof, as applied to the vibration isolator.

Hysteresis loop 510 may illustrate characteristic behavior of the vibration isolator 130 in response to relatively low velocity displacements (low $d\Delta/dt$), and hysteresis loop 520 may illustrate characteristic behavior of the vibration isolator 130 in response to relatively high velocity displacements (high $d\Delta/dt$). As a result of the viscous damping properties of the vibration isolator 130 illustrated by diagram 500, the hysteresis loop 520 may have a greater enclosed area than the hysteresis loop 510 (e.g., for the same amount of relative displacements along the $\Delta$ axis). Accordingly, the vibration isolator 130 illustrated by diagram 500 may provide greater dissipation of energy for high rates of relative displacement. The viscous damping property may, for example, be illustrated by the higher magnitude of the slope of the hysteresis loop ($dF/d\Delta$) as it crosses the point of zero displacement $\Delta$. In some examples vibration isolators 130 having such viscous damping properties may be particularly beneficial when greater dissipation of energy at higher frequencies, or for shock loading, is desirable. In some examples, where lower-frequency energy dissipation is of particular importance, viscous damping properties may be of diminished value. Such applications may benefit from damping materials having relatively high hysteretic damping properties that are not dependent on strain rate, which may be used to provide a higher damping ratio between a crystal oscillator assembly 110 and a base structure 120 at lower frequencies.

FIGS. 6A-6D illustrate examples of shapes for circumferential vibration isolators 130-c, 130-d, 130-e, and 130-f in accordance with aspects of the present disclosure.

Figure 6A:
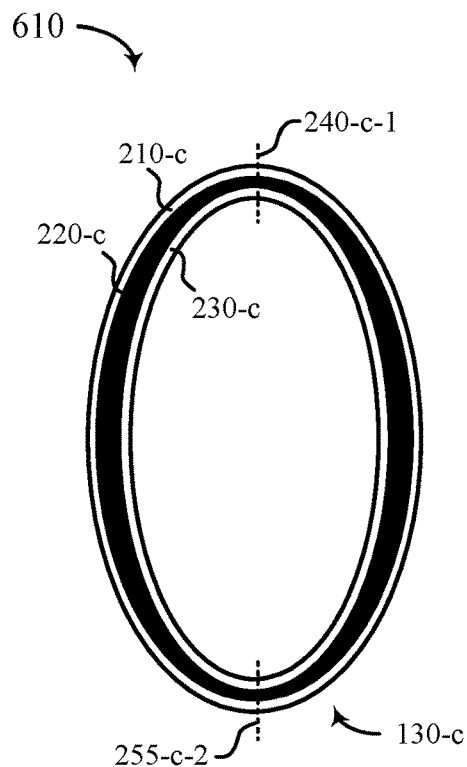
FIGS. 6A-6D illustrate examples of shapes for circumferential vibration isolators in accordance with aspects of the present disclosure.

FIG. 6A shows a front view 610 illustrating a vibration isolator 130-c having an elliptical cross-sectional shape. The vibration isolator 130-c includes a spring material layer 210-c, a damping material layer 220-c, and a constraint layer 230-c, with coupling locations 240-c-1 and 240-c-2 that may be coupled with either a crystal oscillator assembly 110 or a base structure 120. As shown, the damping material layer 220-c may have a thickness (e.g., perpendicular to the surface of the spring material layer 210-c) that varies about the circumferential length of the spring material layer 210-c. The damping material layer 220-c may be designed, for example, to have a greater thickness in areas that experience relatively high transverse shear in response to dynamics that are to have higher energy dissipation. Thus, damping characteristics of a vibration isolator 130 may be tuned by employing a damping material layer of varying thickness. Similarly, although not shown, the stiffness characteristics of a vibration isolator 130 may be tuned (e.g., for stiffness, or for stiffness progression as a function of displacement) by employing a spring material layer 210 and/or a constraint layer 230 having material layers of varying thickness.

The vibration isolator 130-c is also an example that illustrates a circumferential constraint layer, in which case the constraint layer 230-c may be considered to be adhered to the damping material layer 220-c along an entire length of the spring material layer 210-c. The constraint layer 230-c may be formed from a continuous circumferential ring, or may be a band disposed on the damping material layer 220-b with overlapping ends. In examples where the constraint layer 230-c is a continuous circumferential ring, the vibration isolator 130-c may be formed by fixturing the constraint layer 230-c concentrically with the spring material layer 210-c, and the damping material layer 220-c may be injection molded or extruded between the spring material layer 210-c and the constraint layer 230-c.

Figure 6B:
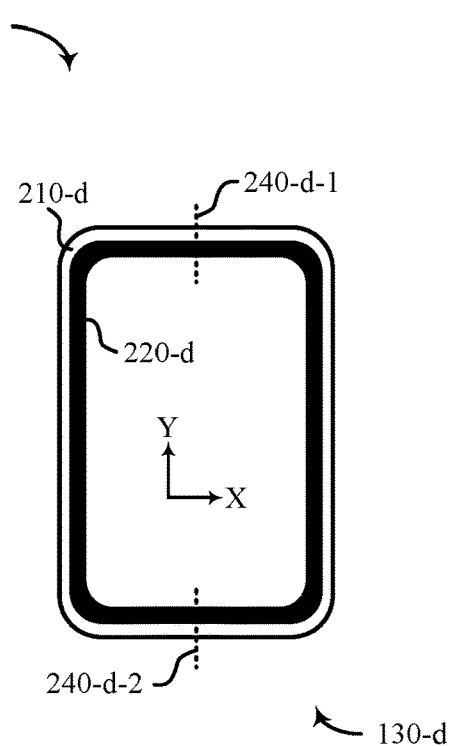

FIG. 6B shows a front view 620 illustrating a vibration isolator 130-d having a rectangular cross-sectional shape (e.g., with rounded corners). The vibration isolator 130-d includes a spring material layer 210-d, and a damping material layer 220-d, with coupling locations 240-d-1 and 240-d-2 that may be coupled with either a crystal oscillator assembly 110 or a base structure 120. The vibration isolator 130-d may be an example of a vibration isolator that lacks a constraint layer. Despite lacking a constraint layer, the vibration isolator 130-d may still have suitable damping characteristics for a particular application, and omitting a constraint layer may reduce complexity of the vibration isolator 130-d. Further, by employing a rectangular cross-sectional shape, the difference in stiffness between a crystal oscillator assembly 110 and a base structure 120 in the X direction and the Y direction of the vibration isolator 130-d may be relatively high (e.g., having a high transmission or low isolation in the Y direction, and low transmission or high isolation in the X direction).

Figure 6C:
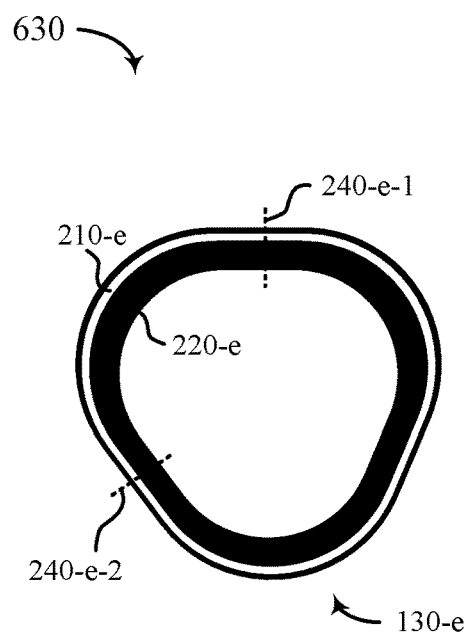

FIG. 6C shows a front view 630 illustrating a vibration isolator 130-e having a triangular cross-sectional shape (e.g., with rounded corners). The vibration isolator 130-e includes a spring material layer 210-e, and a damping material layer 220-e, with coupling locations 240-e-1 and 240-e-2 that may be coupled with either a crystal oscillator assembly 110 or a base structure 120. The vibration isolator 130-d may be an example of a vibration isolator with coupling locations that are not on opposite sides of a cross-sectional area. For example, the first coupling location 240-*e*-1 and the second coupling location 240-*e*-2 may be on non-parallel faces of the spring material layer 210-*e*, which may provide desirable dynamic characteristics, and/or may provide favorable packaging or assembly characteristics.

Figure 6D:
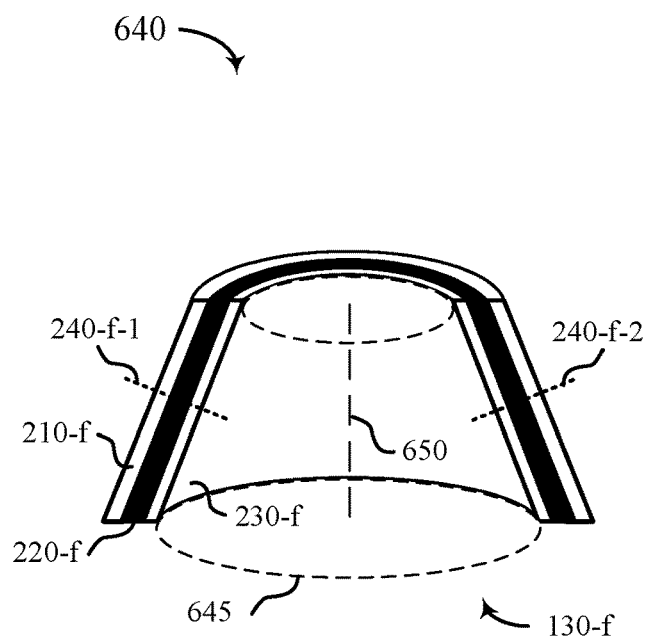

FIG. 6D shows a diagonal view 640 illustrating a vibration isolator 130-*f* that borders a volume 645 having a shape of a frustum of a cone. The vibration isolator 130-*e* includes a spring material layer 210-*f*, a damping material layer 220-*f*, and a constraint layer 230-*f*, with coupling locations 240-*f*-1 and 240-*f*-2 that may be coupled with either a crystal oscillator assembly 110 or a base structure 120. The vibration isolator 130-*f* may be an example of a vibration isolator with coupling locations that are on opposite sides of a cross-sectional volume, but are non-parallel faces of the spring material layer 210-*f*. For example, the first coupling location 240-*f*-1 and the second coupling location 240-*f*-2 may be on opposite faces of the cone-shaped spring material layer 210-*e*, which may also provide desirable dynamic characteristics, and/or may provide favorable packaging or assembly characteristics.

In some examples the vibration isolator 130-*f* may be formed by applying a fluid form of the damping material of damping material layer 220-*f* to the spring material layer 210-*f*, and the constraint layer 230-*f* may be inserted into the spring material layer 210-*f* (e.g., along centerline 650), thereby squeezing the fluid form of the damping material layer 220-*f* against the faces of the spring material layer 210-*f* and the constraint layer 230-*f*. Excess material that squeezes past the top and bottom edges of the spring material layer 210-*f* may be subsequently cleaned off or trimmed.

Although the spring material layer 210-*f*, the damping material layer 220-*f*, or the constraint layer 230-*f* may be described as bordering a volume 645 having the shape of a frustum of a cone, other examples of a bordered volume may include a frustum of a pyramid, a frustum of a slant cone, a frustum of a slant pyramid, a slant cylinder, or any other prism. For example, the vibration isolator 130-*c* described with reference to FIG. 6A may be described as bordering a volume in the shape of an elliptical prism, and the vibration isolators 130-*d* and 130-*e* described with reference to FIGS. 6B and 6C may be described as bordering a volume in the shape of a polygonal prism (e.g., with rounded corners).

Although the vibration isolators 130 of FIGS. 6A through 6D provide example configurations, it would be readily apparent to one of ordinary skill in the art, in view of the descriptions of the present disclosure, that additional shapes of vibration isolators 130 may be employed to address various design criteria for a particular system.

FIGS. 7A-7D illustrate examples of damping material layers and constraint layers for circumferential vibration isolators 130-*g*, 130-*h*, 130-*i*, and 130-*j* in accordance with aspects of the present disclosure. The vibration isolators 130-*g*, 130-*h*, 130-*i*, and 130-*j* may have the same general shape as the vibration isolator 130-*a* described with reference to FIG. 2, but may have alternate configurations of layers.

Figure 7A:
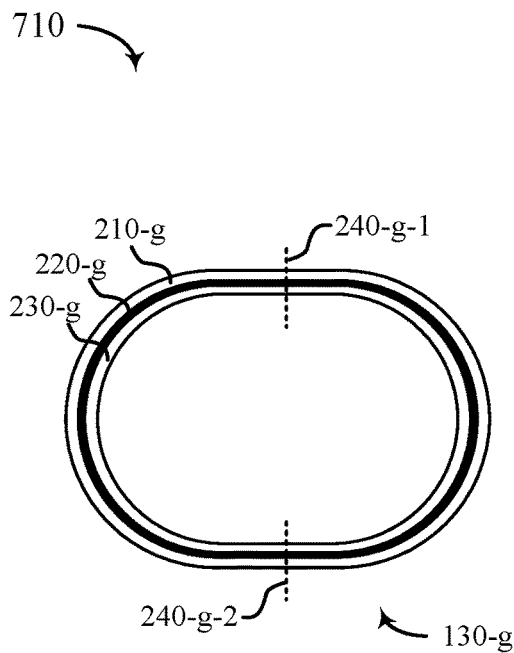
FIGS. 7A-7D illustrate examples of damping material layers and constraint layers for circumferential vibration isolators in accordance with aspects of the present disclosure.

FIG. 7A shows a front view 710 illustrating an example of a circumferential vibration isolator 130-*g* having a circumferential spring material layer 210-*g*, a circumferential damping material layer 220-*g*, and a circumferential constraint layer 230-*g*, with coupling locations 240-*g*-1 and 240-*g*-2 that may be coupled with either a crystal oscillator assembly 110 or a base structure 120. The damping material layer 220-*g* is an example of a damping material layer that is adhered along an entire length of the spring material layer. Further, the damping material layer 220-*g* is an example of a damping material layer that is disposed on an inward face of the circumferential spring material layer 210-*g*. The constraint layer 230-*g* is an example of a constraint layer that is adhered to the damping material layer 220-*g* along an entire length of the spring material layer 210-*g*.

Figure 7B:
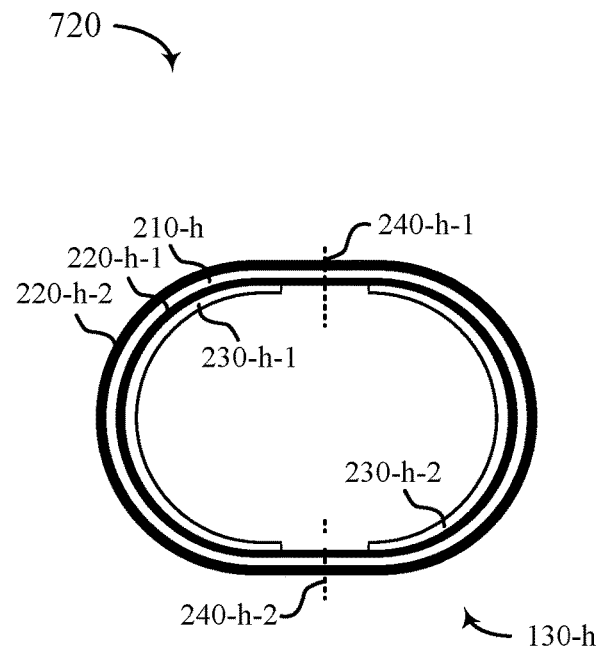

FIG. 7B shows a front view 720 illustrating an example of a circumferential vibration isolator 130-*h* having a circumferential spring material layer 210-*h*, a first circumferential damping material layer 220-*h*-1 on a first side of the circumferential spring material layer 210-*h*, and a second damping material layer 220-*h*-2 on a second side of the circumferential spring material layer 210-*h*. The circumferential vibration isolator 130-*h* also includes a first constraint layer 230-*h*-1 adhered to the first damping material layer 220-*h*-1 at a first end of the circumferential vibration isolator 130-*h*, and a second constraint layer 230-*h*-2 adhered to the first damping material layer 220-*h*-1 at a second end of the circumferential vibration isolator 130-*h*. The vibration isolator 130-*h* may include coupling locations 240-*h*-1 and 240-*h*-2 that may be coupled with either a crystal oscillator assembly 110 or a base structure 120. The first damping material layer 220-*h*-1 and the second damping material layer 220-*h*-2 are each examples of a damping material layer that is adhered along an entire length of the spring material layer. Further, the damping material layers 220-*h*-1 and 220-*h*-2 may be an example of damping material layers disposed on both an inward face and an outward face of the circumferential spring material layer. In various examples the damping material layers 220-*h*-1 and 220-*h*-2 may be disposed as separate layers, or may be connected to each other around the edges of the spring material layer 210-*h* (not shown). For example, the damping material layers 220-*h*-1 and 220-*h*-2 may be formed by dipping the spring material layer 210-*h* in a viscoelastic material. The first constraint layer 230-*h*-1 and the second constraint layer 230-*h*-2 may be an example of a constraint layer made of separate portions adhered to the damping material layer 220-*h* at a plurality of locations along a length of the spring material layer. Although not shown, in some examples additional constraint layers may be adhered on the second side of the circumferential spring material layer 210-*h* (e.g., the outer face, adhered to the second damping material layer 220-*h*-2)

Figure 7C:
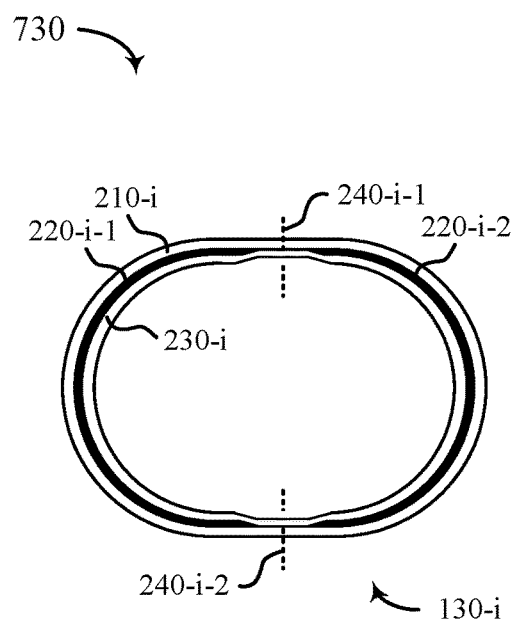

FIG. 7C shows a front view 730 illustrating an example of a circumferential vibration isolator 130-*i* having a circumferential spring material layer 210-*i*, a first circumferential damping material layer 220-*i*-1 at a first end of the circumferential spring material layer 210-*i*, and a second damping material layer 220-*i*-2 on a second end of the circumferential spring material layer 210-*i*. The circumferential vibration isolator 130-*i* also includes a constraint layer 230-*i*, which may be adhered to the first damping material layer 220-*i*-1 and the second damping material layer 220-*i*-2, and may be coupled with the spring material layer 210-*i*. The vibration isolator 130-*i* may include coupling locations 240-*i*-1 and 240-*i*-2 that may be coupled with either a crystal oscillator assembly 110 or a base structure 120. By coupling the constraint layer 230-*i* with the spring material layer 210-*i* at the coupling locations 240-*i*-1 and 240-*l*-2, the coupling locations 240-*i*-1 and 240-*i*-2 may be more rigid than coupling locations 240 that include an intervening damping material layer 220, which may improve coupling with a crystal oscillator assembly 110 or a base structure 120. For example, when using a fastener 140 to couple the vibration isolator 130-*i* with a crystal oscillator assembly 110 or a base structure 120, a more rigid coupling location 240-$i$-1 or 240-$i$-2 may provide a more uniform clamping surface for the fastener 140, and/or may be less likely to experience yielding and/or fatigue failure of the spring material layer 210-$i$ or constraint layer 230-$i$ near the fastener due to relatively large deformation of an intervening damping material layer 220 from a clamping force of the fastener 140.

In some examples, the constraint layer 230-$i$ may be adhered to the spring material layer 210-$i$ by way of welding, brazing, soldering, or adhesive bonding. In other examples, the constraint layer 230-$i$ may not be adhered to the spring material layer 210-$i$, and the layers may instead be clamped together by fasteners (e.g., fasteners 140-$a$ or 140-$b$ as described with reference to FIG. 1). The first damping material layer 220-$i$-1 and the second damping material layer 220-$i$-2 may be an example of a damping material layer made of separate portions adhered to the spring material layer 210-$i$ at a plurality of locations along a length of the spring material layer 210-$i$.

Figure 7D:
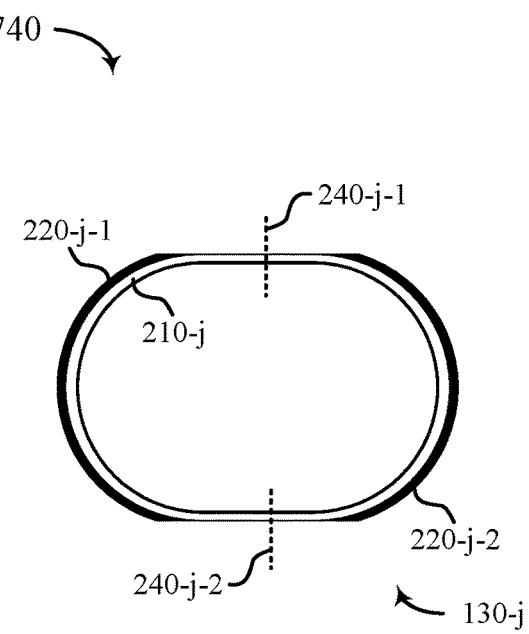

FIG. 7D shows a front view 740 illustrating an example of a circumferential vibration isolator 130-$j$ having a circumferential spring material layer 210-$j$, a first circumferential damping material layer 220-$j$-1 at a first end of the circumferential spring material layer 210-$j$, and a second damping material layer 220-$j$-2 on a second end of the circumferential spring material layer 210-$j$. The vibration isolator 130-$j$ may include coupling locations 240-$j$-1 and 240-$j$-2 that may be coupled with either a crystal oscillator assembly 110 or a base structure 120. Vibration isolator 130-$j$ may be an example of a vibration isolator that lacks a constraint layer. The damping material layers 220-$j$-1 and 220-$j$-2 are an example of a damping material layer that is disposed on an outward face of the circumferential spring material layer 210-$j$, and made of separate portions adhered to the spring material layer 210-$i$ at a plurality of locations along a length of the spring material layer 210-$i$. Although only two portions are shown on vibration isolator 130-$j$, different vibration isolators 130 may have more than two portions, which may be on the inward face of the spring material layer 210-$j$, the outward face of the spring material layer 210-$j$, or both.

Although the vibration isolators 130-$g$, 130-$h$, 130-$i$, and 130-$j$ of FIGS. 7A through 7D provide example configurations for layers of a vibration isolator, it would be readily apparent to one of ordinary skill in the art, in view of the descriptions of the present disclosure, that additional configurations of layers may be employed in vibration isolators 130 to address various design criteria for a particular system.

Figure 8A:
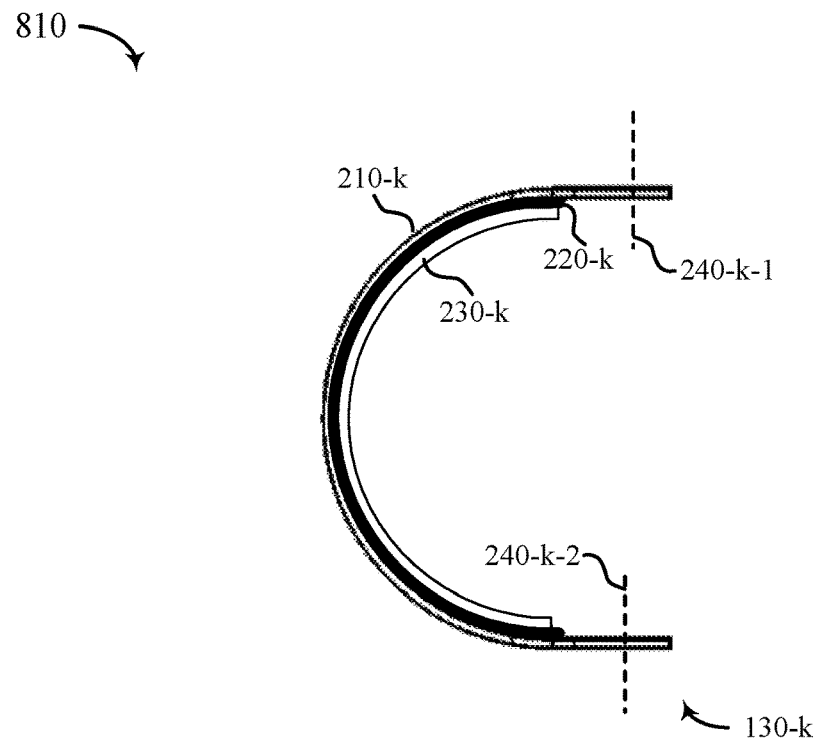
FIGS. 8A and 8B illustrate examples of arcuate vibration isolators in accordance with aspects of the present disclosure.
Figure 8B:
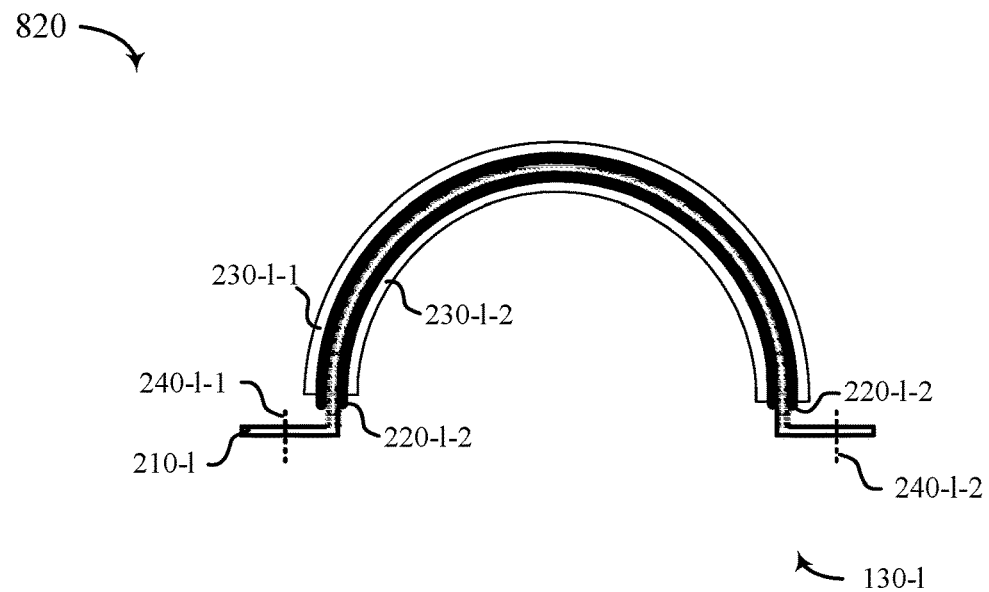

FIGS. 8A and 8B illustrate examples of arcuate vibration isolators 130-$k$ and 130-$l$ in accordance with aspects of the present disclosure. In contrast to the vibration isolators 130-$a$ through 130-$j$ described with reference to FIGS. 1 through 7D, the vibration isolators 130-$k$ and 130-$l$ do not enclose a cross sectional area (e.g., in a front view). Rather, vibration isolators 130-$k$ and 130-$l$ may include spring material layers 210-$k$ and 210-$l$ formed of a band of spring material that forms an arcuate shape as viewed in a front view.

FIG. 8A shows a front view 810 illustrating an example of an arcuate vibration isolator 130-$k$ having an arcuate spring material layer 210-$k$, an arcuate damping material layer 220-$k$, and an arcuate constraint layer 230-$k$, with coupling locations 240-$k$-1 and 240-$k$-2 that may be coupled with either a crystal oscillator assembly 110 or a base structure 120. The damping material layer 220-$k$ is an example of a damping material layer that is disposed on an inward face of the arcuate spring material layer 210-$k$. The constraint layer 230-$k$ may be an example of a constraint layer that is adhered to the damping material layer 220-$k$ along substantially an entire length of the damping material layer 220-$g$.

FIG. 8B shows a front view 820 illustrating an example of am arcuate vibration isolator 130-$l$ having am arcuate spring material layer 210-$l$, a first arcuate damping material layer 220-$l$-1 on an outward face of the arcuate spring material layer 210-$l$, and a second arcuate damping material layer 220-$l$-2 on an inward face of the arcuate spring material layer 210-$l$. The arcuate vibration isolator 130-$l$ also includes a first constraint layer 230-$l$-1 adhered to an outward face of the first damping material layer 220-$l$-1, and a second constraint layer 230-$l$-2 adhered to the inward face of the second damping material layer 220-$l$-2. The arcuate vibration isolator 130-$l$ may include coupling locations 240-$l$-1 and 240-$l$-2 that may be coupled with either a crystal oscillator assembly 110 or a base structure 120.

The damping material layers 220-$l$-1 and 220-$l$-2 may be an example of damping material layers disposed on both an inward face and an outward face of the arcuate spring material layer 210-$l$. In various examples the damping material layers 220-$l$-1 and 220-$l$-2 may be disposed as separate layers, or may be connected to each other around the edges of the spring material layer 210-$l$ (not shown). For example, the damping material layers 220-$l$-1 and 220-$l$-2 may be formed by dipping at least a portion of the spring material layer 210-$l$ in a viscoelastic material.

In some examples, multiple arcuate vibration isolators 130 may be combined between the same coupling locations of a crystal oscillator assembly 110 and a base structure 120. For example, two of the arcuate vibration isolators 130-$k$ may be coupled together, opposite from each other and in the same plane, to provide substantially the same form and function as the circumferential vibration isolator 130-$a$ described with reference to FIG. 2. In other examples more than two arcuate vibration isolators 130 may be combined in a non-coplanar arrangement, providing the function of a generally spherical or other volumetric-shaped vibration isolator 130.

Figure 9:
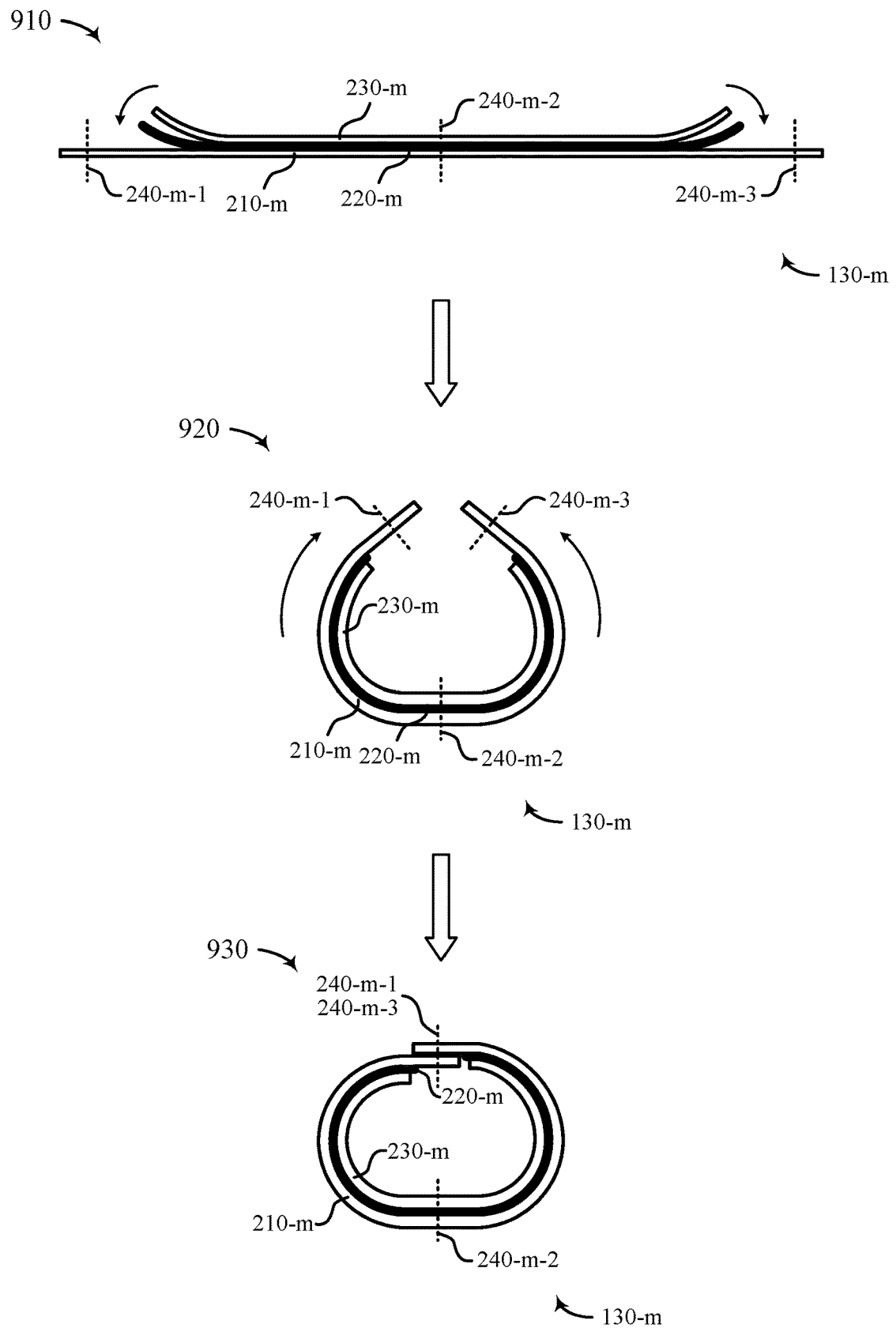
FIG. 9 illustrates an example of steps for forming a circumferential vibration isolator in accordance with aspects of the present disclosure.

FIG. 9 illustrates an example of steps 910, 920, and 930 for forming a circumferential vibration isolator 130-$m$ in accordance with aspects of the present disclosure. The vibration isolator 130-$m$ may be formed from a spring material layer 210-$m$, a damping material layer 220-$m$, and a constraint layer 230-$m$. The vibration isolator 130-$m$ includes a first coupling location 240-$m$-1, a second coupling location 240-$m$-2, and a third coupling location 240-$m$-3.

In step 910, the spring material layer 210-$m$, the damping material layer 220-$m$, and the constraint layer 230-$m$ may be adhered together. In various examples, one of more of the layers may have an integrated adhesive layer, or the layers may be adhered together based on an adhesive property of the damping material layer 220-$m$. In some examples, the damping material layer 220-$m$ may be a strip of viscoelastic foam with adhesive on both faces. In such examples, a first adhesive layer of the damping material layer 220-$m$ may first be adhered to the spring material layer 210-$m$, and then the constraint layer 230-$m$ may be adhered to the other adhesive layer of the damping material layer 220-$m$. Although each of the layers are shown as being generally flat and continuous material layers, any one or more of the spring material layer 210-$m$, the damping material layer 220-$m$, or the constraint layer 230-$m$ may be bent, creased, perforated, or otherwise pre-shaped.

In step 920, the stack of layers of the vibration isolator 130-*m* may be curled together, bringing together the first coupling location 240-*m*-1 and the third coupling location 240-*m*-3. In some examples, the shape shown with reference to step 920 may alternatively be illustrative of the shape of pre-formed layers used in the adhering of step 910, which may alleviate an amount of strain in a neutral condition of the layers (e.g., a neutral condition of loading scenario 301 described with reference to FIG. 3).

In step 930, the first coupling location 240-*m*-1 and the third coupling location 240-*m*-3 may be coupled together. For example, first coupling location 240-*m*-1 and the third coupling location 240-*m*-3 may be welded, soldered, brazed, or bonded together. In other examples, the first coupling location 240-*m*-1 and the third coupling location 240-*m*-3 may be coupled together with a fastener, such as fasteners 140-*a* or 140-*b* described with reference to FIG. 1. Although the spring material layer 210-*m* is overlapped at the coupled location of the first coupling location 240-*m*-1 and the third coupling location 240-*m*-3, the vibration isolator 130-*m* may still be an example of a circumferential vibration isolator as described herein.

The detailed description set forth above in connection with the appended drawings describes exemplary embodiments and does not represent the only embodiments that may be implemented or that are within the scope of the claims. The term "example" used throughout this description means "serving as an example, instance, or illustration," and not "preferred" or "advantageous over other embodiments." The detailed description includes specific details for the purpose of providing an understanding of the described techniques. These techniques, however, may be practiced without these specific details. In some instances, well-known structures and devices are shown in block diagram form in order to avoid obscuring the concepts of the described embodiments.

The foregoing description and claims may refer to elements or features as being "connected" or "coupled" together. As used herein, unless expressly stated otherwise, "connected" means that one element/feature is directly or indirectly connected to another element/feature. Likewise, unless expressly stated otherwise, "coupled" means that one element/feature is directly or indirectly coupled with another element/feature.

The functions described herein may be implemented in various ways, with different materials, features, shapes, sizes, or the like. Other examples and implementations are within the scope of the disclosure and appended claims. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

The description of the present disclosure is provided to enable a person skilled in the art to make or use the disclosure. Various modifications to the disclosed examples will be apparent, in view of the descriptions of the present disclosure, to those skilled in the art, and the generic principles defined herein may be applied to other variations without departing from the scope of the disclosure. Thus, the disclosure is not to be limited to the examples and designs described herein but is to be accorded the widest scope consistent with the principles and novel features disclosed.

What is claimed is:

1. An apparatus, comprising:
   a crystal oscillator assembly;
   a base structure; and
   one or more vibration isolators coupled between the crystal oscillator assembly and the base structure and supporting a sprung mass of the crystal oscillator assembly with respect to the base structure, wherein each of the one or more vibration isolators comprises:
   a spring material layer for providing a spring force between the crystal oscillator assembly and the base structure in response to relative movement between the crystal oscillator assembly and the base structure; and
   a damping material layer adhered to at least one side of the spring material layer, the damping material layer providing a damping force between the crystal oscillator assembly and the base structure in response to the relative movement between the crystal oscillator assembly and the base structure.

2. The apparatus of claim 1, wherein at least one of the vibration isolators further comprises a constraint layer adhered to the damping material layer opposite from the spring material layer, such that the damping material layer is coupled between the constraint layer and the spring material layer.

3. The apparatus of claim 2, wherein the constraint layer comprises a same material as the spring material layer.

4. The apparatus of claim 2, wherein the constraint layer provides a second spring force in response to relative movement between the crystal oscillator assembly and the base structure.

5. The apparatus of claim 2, wherein the constraint layer is adhered to the damping material layer along an entire length of the spring material layer.

6. The apparatus of claim 2, wherein the constraint layer comprises separate portions adhered to the damping material layer at a plurality of locations along a length of the spring material layer.

7. The apparatus of claim 1, wherein, for the at least one of the vibration isolators, the damping material layer is adhered along an entire length of the spring material layer.

8. The apparatus of claim 1, wherein, for the at least one of the vibration isolators, the damping material layer comprises separate portions adhered at a plurality of locations along the length of the spring material layer.

9. The apparatus of claim 1, wherein, for at least one of the vibration isolators, the spring material layer comprises a circumferential ring of spring material.

10. The apparatus of claim 9, wherein, for the at least one of the vibration isolators, the damping material layer is disposed on one or both of an inward face of the circumferential ring of spring material or an outward face of the circumferential ring of spring material.

11. The apparatus of claim 9, wherein, for the at least one of the vibration isolators, the circumferential ring of spring material borders a volume having shape of a cylinder, an elliptical prism, a polygonal prism, a polygonal prism with radiused corners, a frustum of a cone, or a frustum of a pyramid.

12. The apparatus of claim 9, wherein, for the at least one of the vibration isolators, the circumferential ring of spring material has a rectangular cross-section perpendicular to a circumferential length of the circumferential ring.

13. The apparatus of claim 12, wherein the rectangular cross-section has a width measured in a direction perpendicular to a plane of an area enclosed by the circumferential ring that is greater than a thickness measured in a direction from the area enclosed by the circumferential ring in the plane of the area enclosed by the circumferential ring.

14. The apparatus of claim 1, wherein, for at least one of the vibration isolators, the spring material layer comprises an arcuate band between the crystal oscillator assembly and the base structure.

15. The apparatus of claim 1, wherein each of the vibration isolators provides a respective first stiffness with respect to a first direction of the relative movement between the crystal oscillator assembly and the base structure, and a respective second stiffness, different from the respective first stiffness, with respect to a second direction of the relative movement between the crystal oscillator assembly and the base structure.

16. The apparatus of claim 1, wherein the spring material layer for at least one of the vibration isolators comprises a metal, a metal alloy, a polymer, or a composite.

17. The apparatus of claim 1, wherein the damping material layer for at least one of the vibration isolators comprises a viscoelastic material.

18. The apparatus of claim 1, wherein the damping force for at least one of the vibration isolators comprises a hysteretic damping force, a viscous damping force, or a combination thereof.

19. The apparatus of claim 1, wherein at least one of the vibration isolators further comprises a threaded coupling, comprising a threaded hole or a threaded stud, for a coupling with the crystal oscillator assembly or the base structure.

20. The apparatus of claim 1, wherein at least one of the vibration isolators is coupled with one or both of the crystal oscillator assembly or the base structure by way of a bolt and a nut, a screw, a rivet, welding, brazing, soldering, adhesive bonding, or a combination thereof.

* * * * *